United States Patent [19]

Grobe

[11] 4,344,049
[45] Aug. 10, 1982

[54] SURFACE WAVE COMPONENT

[75] Inventor: Friedrich Grobe, Munich, Fed. Rep. of Germany

[73] Assignee: Siemens Aktiengesellschaft, Berlin & Munich, Fed. Rep. of Germany

[21] Appl. No.: 181,825

[22] Filed: Aug. 27, 1980

[30] Foreign Application Priority Data

Sep. 24, 1979 [DE] Fed. Rep. of Germany ....... 2938542

[51] Int. Cl.³ ..................... H03H 9/145; H03H 9/25; H03H 9/64; H03H 9/42
[52] U.S. Cl. ............................. 333/154; 310/313 B; 333/193
[58] Field of Search ............................. 333/150–155, 333/193–196; 330/3.5; 331/107 A; 310/313 R, 313 A, 313 B, 313 C, 313 D

[56] References Cited

U.S. PATENT DOCUMENTS

| 3,582,838 | 6/1971 | DeVries | 333/194 |
| 3,676,721 | 7/1972 | Van Den Heuvel | 333/154 X |
| 3,894,251 | 7/1975 | Shibayama et al. | 333/154 X |
| 3,904,996 | 9/1975 | Rosenfeld | 333/196 |
| 4,035,675 | 7/1977 | Malocha et al. | 333/196 X |

OTHER PUBLICATIONS

Toda et al.–"Lamb-Wave Device with Three Operation Modes", Electronics Letters, Nov. 23, 1978, vol. 14, No. 24, pp. 747-748.

Toda (Shinoda), "Lamb Wave Device for Amplitude Modulation", J. Acoust. Soc. Am. 65(2), Feb. 1979, pp. 537-540.

Primary Examiner—Marvin L. Nussbaum
Attorney, Agent, or Firm—Hill, Van Santen, Steadman, Chiara & Simpson

[57] ABSTRACT

A surface wave component has a pair of interdigital transducer comb structures carried spaced apart on a surface of a substrate which is carried on a base plate. In one embodiment, signal leads extend beneath the substrate to areas adjacent the rear portions of the comb structures and are capacitively coupled thereto via the substrate which is a dielectric. In another embodiment, inductive coupling loops interconnect the rear portions of the comb structures of a respective transducer and another inductive loop is carried on the opposite side of the substrate for signal coupling. In both embodiments both symmetrical and asymmetrical signal coupling is provided by utilizing a grounding plate or layer as a signal lead.

16 Claims, 5 Drawing Figures

SURFACE WAVE COMPONENT

BACKGROUND OF THE INVENTION

1. Field of the Invention

The present invention relates to a surface wave component which has transducer structures arranged on the front side of a substrate which is carried by a base plate, the transducer structure having rear portions for connection of the fingers thereof.

2. Description of the Prior Art

From the state of the art, surface wave components, inn particular, surface wave filters, are known, in which, in a transducer applied on a substrate, acoustic surface waves are piezoelectrically generated which travel in the surface of the substrate and, in a transducer, are again piezoelectrically converted into electrical output signals. These transducers, as a rule, are interdigital comb structures consisting of a metallization of the surface of the substrate. The individual fingers of these comb structures have a common connection, respectively, which are designated hereinafter as the "rear" portion of a transducer.

For supplying an electrical signal, to be input in the surface wave component, and for taking off the electrical output signal, up to now corresponding leads to the connection lines have been employed. According to the state of the art, wire feed lines and terminal lugs have been employed for this purpose, which, in a respectively suitable fashion, are secured to the rear portions of the transducers. The problems which has always presented itself has been to secure these leads to the rear portions of the individual transducers in such a manner that the mounting thereof has no interfering influence on the propagation of the acoustic surface waves.

SUMMARY OF THE INVENTION

The object of the present invention is to provide measures which with the problem of a suitable signal supply, or signal removal, with respect to the transducers can be improved, in particular, with regard to decreasing interfering influences on wave propagation.

The above object is achieved for a surface wave component of the type mentioned above in which a capacitive or inductive coupling is provided between the respective transducer and the leads, or between a conductor loop connecting the rear portions of a transducer structure and carried on the surface of the substrate and an additional conductor loop, whereby the leads, or the additional conductor loop, are arranged in the region of the rear side of the substrate, whereby the leads, or the additional conductor loop, respectively are arranged opposite to the respective rear portions, or respective conductor loop, which are carried on the front side of the substrate.

The basis of the invention is the recognition that galvanic supply lines, to be secured to the transducers could, at best, with a technical expense which is no longer justified, be somehow improved in this regard. Therefore, the invention proceeds from the entirely different consideration of achieving signal supply and signal removal by capacitive or inductive structures, and in particular by such capacitances and inductances which are realized on the substrate itself in a type of integrated construction.

According to one embodiment of the invention, the material of the substrate member forms the dielectric of a respective coupling capacitance, a relatively wide rear portion of the respective comb electrode of the transducer secured on the front side of the substrate forms one electrode, and an electrode coating in the region of the rear of the substrate, disposed opposite the first electrode, forms the other electrode.

For an embodiment having inductive transmission, there is provided, on the front side of the substrate, a coupling loop which electrically interconnects two comb electrodes of the respective transducer. An identical second coupling loop, respectively, is provided in the region thereof on the opposite side of the substrate.

For both of the above-described embodiments, galvanic supply leads are provided, which here, in the case of the present invention, however, for the first embodiment, are connected to the respective electrodes in the region of the rear side of the substrate, or, for the other embodiment, are connected to the coupling loop disposed in the region of the rear side of the substrate. An interfering influence of these connections of the leads does not occur, since the surface wave, propagating on the surface of the substrate between the input transducer and the output transducer has no effect extending so far into the substrate and certainly not at all extending to the rear side of the substrate.

In practicing the present invention, directly or indirectly, a series of advantages is attained. For the securing of the terminals on the electrodes, or coupling loops, respectively, now disposed beneath the rear side of the substrate, much less technical expense is required than would be necessary for a known wire connection on the front side. For bonding of the feed wires to the terminal lugs of the transducers, provided in the state of the art, measures such as heating and metal coating of the terminal lugs, as well as a considerable minimal dimension for the thickness of the substrate, are necessary. Such measures can be dispensed with in practicing the present invention; in particular, the substrate can be kept relatively thin. In the present invention, moreover, no isolating capacitors are necessary, as are employed in individual instances in the state of the art devices, for the purpose of keeping dc voltages remote from the surface wave component.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 2:
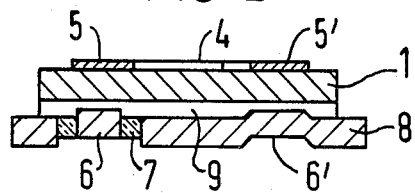
FIG. 2 is a sectional view taken generally along the line II—II of FIG. 1.
Figure 1:
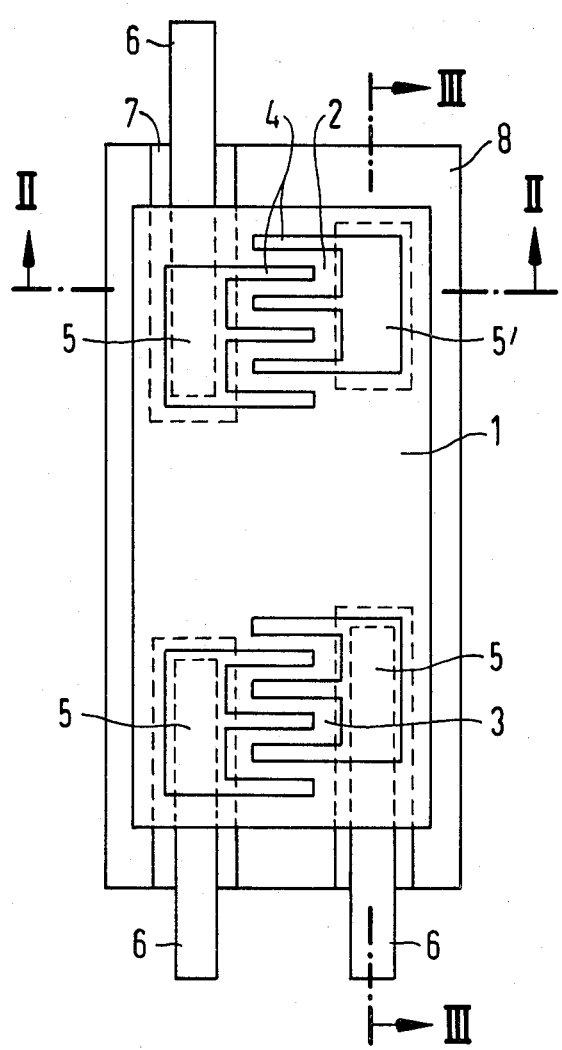
FIG. 1 is a plan view of a surface wave component constructed in accordance with the present invention and having capacitive coupling.
Figure 3:
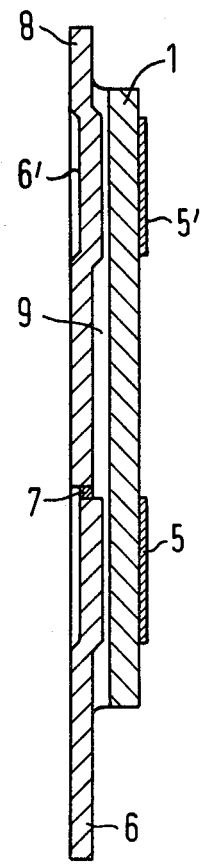
FIG. 3 is a sectional view taken generally along the line III—III of FIG. 1.

Referring to FIGS. 1-3, an exemplary embodiment of the invention is illustrated which comprises a substrate 1, for example consisting of monocrystalline lithium niobate. The substrate 1 carries a first interdigital transducer comb structure 2 and a second interdigital transducer comb structure 3 which serve as an input transducer and an output transducer, respectively. Such known transducer structures 2 and 3 consist of interengaging fingers 4 which are connected in alternate succession with the rear portions 5 and 5' which serve as connections. The transducers 2 and 3, or the electrode fingers 4, respectively, and the rear portions 5 and 5' are, for example, metal layers of extremely small thickness applied on the front side of the substrate 1 according to known photolithographic procedures.

A base plate 8 carries the substrate 1, in a known manner, and is secured thereto with a cement 9 which also acts as an attenuation material.

Individual terminal lugs 6 are also illustrated which, in the simplest manner, form the respective counterelectrode to the pertaining rear portion 5 of the respective comb structure, oppositely disposed on the other side of the substrate 1. The layer thickness of the cement 9 between the respective terminal lug 6 and the rear side of the substrate 1 is kept as small as possible. Electrical insulations 7 provides a mechanical support for the terminal lug 6 with respect to the metal base plate.

As can be seen in FIGS. 1-3, no special terminal lug 6 (by way of comparison with the rear portion 5) is provided for the rear portion 5'. For the rear portion 5' the base plate 8, which is connected to ground, acts as a counter electrode. For the transducer structure 2, however, there is an asymmetrical input. Advantageously, the portion of the base plate 8, emphasized with the reference character 6' is upwardly embossed, in the manner illustrated, so that, between the portion 6' and the rear side of the substrate 1 and hence between the portion 6' and the rear portion 5' disposed thereabove, a comparatively decreased distance is provided; namely, in order to increase the capacitance to the rear portion 5'. It must be taken into consideration here that the thickness of the cement layer, because of its low dielectric constant, is a comparatively greater factor.

The symmetrically wired transducer 3 has a terminal lug 6 for each rear portion 5.

In the following, numerical information for dimensioning a surface wave component according to FIGS. 1-3 are provided. As the substrate, lithium niobate having a dielectric constant of 50 is employed. The thickness of the substrate amounts, for example, to 0.3 mm. The effective capacitance $C_W$ of every individual transducer amounts to approximately 5 pF given a length of the transducer, i.e. given a length of the rear portion 5 of 4 mm.

For the thickness a' of the film employed as the cement 9 having a dielectric constant of 5, a value of approximately 0.003 mm arises. In the case of such dimensions, a coupling capacitance $C_K$ between a terminal lug, or the portion 6' of the base plate 8, on the one hand, and the rear portion 5, or 5' of the individual transducer 2, 3, of approximately 9 pF can be obtained, if, given the length of 4 mm, the width of the rear and of the terminal lug is made approximately 2 mm, so that the resulting capacitor surface is approximately 7 mm$^2$.

Figure 4:
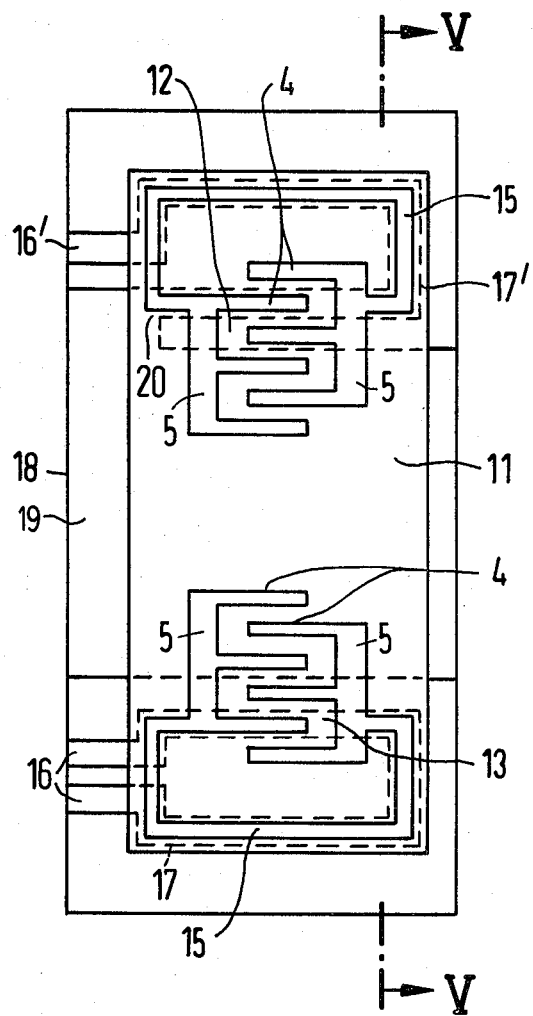
FIG. 4 is a plan view of another embodiment of the invention having inductive couplings.
Figure 5:
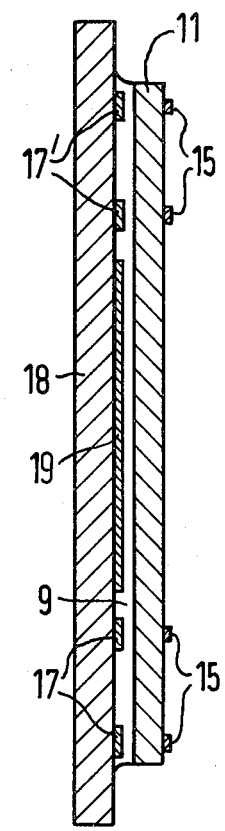
FIG. 5 is a sectional view taken generally along the line V—V of FIG. 4.

The embodiment illustrated in FIGS. 4 and 5 has inductive coupling which exhibits, to a great extent, principally the same details as the embodiment of FIGS. 1-3. In FIGS. 4 and 5, a substrate 11 is cemented to a base plate 18 by way of an insulating cement 9. The base plate 18 is designed in a known layer (or film) technology and carries, generally centrally thereof, a grounding layer 19. A pair of interdigital transducer comb structures 12 and 13 are carried on the top surface of the substrate 11 and each of the comb structures includes fingers 4 extending from a rear portion 5. In the lower portion of FIGS. 4 and 5, a conductive loop 15 is illustrated as being carried on the upper surface of the substrate 11 and connecting the rear portions 5 of the comb structure. On the opposite side of the substrate, and preferably formed in the film technology on the base plate 18, is a conductive loop 17, the loops 15 and 17 serving as a signal coupling structure for the lower transducer. As seen in FIG. 4, the loop 17 has a pair of terminals 16 which extend from beneath the substrate 11 for connection to external circuitry.

In the upper half of FIG. 4, a similar transducer structure is illustrated. Here, and in contrast to the symmetrical signal coupling illustrated for the lower portion, the coupling loop 17' has a single terminal 16' and is connected to the ground layer 19 in the area 20 for asymmetrical signal coupling.

Although I have described by invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A surface wave component comprising:
    a base plate;
    a substrate including a first surface, and a second surface carried on and attached to said base plate;
    a first transducer and a second transducer carried spaced apart on said first surface, each of said transducers including an interdigital structure comprising a pair of rear portions and internested fingers extending therefrom; and
    first and second coupling means for coupling a signal into or out of said component, each of said coupling means located adjacent a respective transducer and each of said coupling means comprising an electrical lead carried on said second surface opposite a respective rear portion and capacitively coupled to the respective rear portion via said substrate, to provide a pair of coupling capacitances.

2. A surface wave component comprising:
    a base plate including electrically conductive material;
    a substrate including a first surface, and a second surface carried on and attached to said base plate;
    a first transducer and a second transducer carried spaced apart on said first surface, each of said transducers including an interdigital structure comprising a pair of rear portions and internested fingers extending therefrom; and
    first and second coupling means for coupling a signal into or out of said component, each of said coupling means located adjacent a respective transducer and at least one of said coupling means comprising an electrical lead carried on said second surface insulating from said substrate and capacitively coupled to one of said rear portions via said substrate.

3. The surface wave component of claim 2, wherein:
    said base plate includes a raised portion extending toward said second surface of said substrate and capacitively coupling said base plate to a rear portion of an interdigital structure.

4. A surface wave component comprising:
a base plate;
a substrate including a first surface, and a second surface carried on and attached to said base plate;
a first transducer and a second transducer carried spaced apart on said first surface, each of said transducers including an interdigital structure comprising a pair of rear portions and internested fingers extending therefrom; and
first and second coupling means for coupling a signal into or out of said component, each of said coupling means located adjacent a respective transducer,
said first coupling means including an electrical lead as a single lead for asymmetric signal coupling carried on said second surface, and
said second coupling means including a pair of other electrical leads spaced apart on said second surface opposite respective rear portions and capacitively coupled thereto via said substrate for symmetrical signal coupling.

5. A surface wave component comprising:
a substrate including dielectric material, a first surface and a second surface;
first and second interdigital transducer comb structures carried spaced apart on said first surface and each including a pair of rear portions and internesting fingers extending from said rear portions;
a first electrical lead attached to said second surface opposite and capacitively coupled to one of said rear portions of said first comb structure;
a second electrical lead attached to said second surface opposite and capacitively coupled to the other of said rear portions of said first comb structure;
a third electrical lead attached to said second surface opposite and capacitively coupled to one of said rear portions of said second comb structure;
a metal base plate including openings therein for insulatingly receiving said first, second and third leads and attached to and insulated from said second surface, said metal base plate including a raised portion opposite and capacitively coupled to the other of said rear portions of said second comb structure.

6. The surface wave component of claim 5, wherein: said substrate comprises lithium niobate.

7. The surface wave component of claim 6, wherein: said substrate has a thickness of 0.3 mm.

8. The surface wave component of claim 5, comprising:
an insulating cement filling the interstices between said base plate, said leads and said substrate.

9. The surface wave component of claim 5, comprising:
first, second and third insulators between the inner ends of the respective first, second and third electrical leads and said base plate.

10. In a surface wave component of the type in which a pair of interdigital transducer comb structures, each including internesting fingers extending from respective rear portions, are carried spaced apart on a surface of a substrate and signal coupling structures are provided for each of the comb structures, the improvement wherein:
each of the signal coupling structures including a first conductive loop connecting the rear portions of the respective comb structure and carried therewith on the substrate surface; and
a second conductive loop carried on the opposite surface of the substrate and inductively coupled to said first conductive loop.

11. A surface wave component comprising:
a base plate including a first surface;
a substrate including a second surface carried on said first surface, and a third surface;
first and second interdigital transducer comb structures carried spaced apart on said third surface, each of said comb structures including a pair of rear portions and internesting fingers extending therefrom; and
first and second signal coupling means for said first and second comb structures, respectively, each coupling means comprising a first conductive loop carried on said third surface and electrically connecting said rear portions of the respective comb structure, and a second conductive loop carried between said first and second surface and inductively coupled to said first conductive loop.

12. The surface wave component of claim 11, and further comprising:
a grounding layer carried on said first surface between said second conductive loops, one of said second conductive loops connected to said grounding layer for asymmetrical signal coupling.

13. The surface wave component of claim 11, comprising:
an insulating cement bonding said first and second surfaces together.

14. The surface wave component of claim 11, wherein:
one of said second conductive loops comprising a pair of terminals extending from beneath said substrate for symmetrical signal coupling.

15. A surface wave component comprising:
a substrate including dielectric material, a first surface and a second surface;
an interdigital transducer comb structure carried on said first surface and including a pair of rear portions and internesting fingers extending from said rear portions;
an electrical lead attached to said second surface opposite and capacitively coupled to one of said rear portions of said interdigital transducer comb structure; and
a metal base plate including an opening therein for insulatingly receiving said electrical lead and attached to and insulated from said second surface, said metal base plate including a portion opposite and field-coupled to the other of said rear portions of said interdigital transducer comb structure.

16. The surface wave component of claim 15, wherein:
said portion of said metal base plate is a raised portion which extends closer to said second surface than the remainder of said base plate and is capacitively coupled to said other rear portion via said substrate.

* * * * *